(12) United States Patent
Ikezawa et al.

(10) Patent No.: US 9,181,971 B2
(45) Date of Patent: Nov. 10, 2015

(54) BUS BAR AND ELECTRONIC DEVICE

(71) Applicant: TDK Corporation, Tokyo (JP)

(72) Inventors: Akira Ikezawa, Tokyo (JP); Masaki Kan, Tokyo (JP)

(73) Assignee: TDK Corporation, Tokyo (JP)

( * ) Notice: Subject to any disclaimer, the term of this patent is extended or adjusted under 35 U.S.C. 154(b) by 212 days.

(21) Appl. No.: 13/680,198

(22) Filed: Nov. 19, 2012

(65) Prior Publication Data

US 2013/0182376 A1 Jul. 18, 2013

(30) Foreign Application Priority Data

Jan. 16, 2012 (JP) ................................. 2012-006406

(51) Int. Cl.
*F16B 37/04* (2006.01)
*H05K 7/14* (2006.01)

(52) U.S. Cl.
CPC ............... *F16B 37/04* (2013.01); *H05K 7/142* (2013.01); *H05K 7/1432* (2013.01); *H05K 2201/10272* (2013.01); *H05K 2201/10409* (2013.01)

(58) Field of Classification Search
CPC ....................................................... F16B 37/04
USPC ....................................................... 174/68.2
See application file for complete search history.

(56) References Cited

U.S. PATENT DOCUMENTS

| | | | |
|---|---|---|---|
| 4,546,408 A * | 10/1985 | Rodseth et al. | 361/720 |
| 5,065,283 A * | 11/1991 | Adachi et al. | 361/775 |
| 6,327,157 B1 * | 12/2001 | Mann et al. | 361/775 |
| 7,589,970 B2 * | 9/2009 | Hsieh | 361/707 |
| 7,722,372 B2 * | 5/2010 | Matsumoto et al. | 439/213 |
| 7,835,153 B2 * | 11/2010 | Kearns | 361/719 |
| 2006/0076671 A1 * | 4/2006 | Kariya et al. | 257/702 |
| 2009/0071683 A1 | 3/2009 | Yasuda et al. | |
| 2011/0127061 A1 | 6/2011 | Gotou | |

FOREIGN PATENT DOCUMENTS

| | | |
|---|---|---|
| JP | 06-177295 A | 6/1994 |
| JP | 2003-264919 A | 9/2003 |
| JP | 2005-353635 A | 12/2005 |
| JP | 2006-074921 A | 3/2006 |
| JP | 2009-071068 A | 4/2009 |
| JP | 2010-103371 A | 5/2010 |
| JP | 2011-144193 A | 6/2011 |

OTHER PUBLICATIONS

Office Action issued on Jul. 7, 2015 in the corresponding JP application No. 2012-006406.
Extended European Search Report issued on Aug. 31, 2015 in the corresponding EP Patent application No. 12196955.4.

* cited by examiner

*Primary Examiner* — Jenny L Wagner
*Assistant Examiner* — Michael P McFadden
(74) *Attorney, Agent, or Firm* — Posz Law Group, PLC

(57) ABSTRACT

A bus bar includes a bus bar body and a spacer provided on the bus bar body, the spacer being an insulator. The bus bar body includes a through hole portion that allows a part of a fixing member for fixing the bus bar body to be inserted therethrough. The spacer includes a head portion and a body portion extending therefrom. When the spacer is provided on the bus bar body, the head portion covers at least part of a peripheral edge region of an end opening of the through hole and the body portion covers an inner peripheral surface of the through hole portion. An outer peripheral surface of the body portion of the spacer is fixedly adhered to the inner peripheral surface of the through hole portion so that resistance occurs when the spacer moves toward the head portion side relative to the bus bar body.

7 Claims, 5 Drawing Sheets

BUS BAR AND ELECTRONIC DEVICE

CROSS-REFERENCE TO PRIOR APPLICATION

This application relates to and claims the benefit of priority from Japanese Patent Application number 2012-006406, filed on Jan. 16, 2012 the entire disclosure of which is incorporated herein by reference.

BACKGROUND

The present invention generally relates to a bus bar and an electronic device including the bus bar.

Conventionally, in hybrid vehicles, electric vehicles and the like, electronic devices such as, for example, DC-DC converter units are used. Such electronic devices (in particular, for example, power supply units including a power supply circuit) include a bus bar that conducts electric power. Since a large current flows in the bus bar, the bus bar generates a large amount of heat and emits heat. The bus bar is attached to, for example, the inside of a chassis of the electronic device.

As techniques relating to bus bars, for example, the technique disclosed in Japanese Patent Laid-Open No. 2011-114193 is known. According to Japanese Patent Laid-Open No. 2011-114193, in a bus bar assembly including a first bus bar and a second bus bar, at least part of the first bus bar is included in a resin molded body and the second bus bar is positioned using a part of the resin molded body.

Also, as techniques for attaching a component to the chassis, for example, the technique disclosed in Japanese Patent Laid-Open No. 2006-74921 is known. According to Laid-Open No. 2006-74921, an upper chassis and a lower chassis are provided, a circuit component is pressed against a bottom plate of the lower chassis via a holding member, and an extremity of the holding member is formed in a stepped shape.

SUMMARY

When a bus bar is attached to a chassis, if the bus bar and the chassis have different potentials, it is necessary to secure insulation between the bus bar and the chassis. Thus, an insulator spacer for securing insulation (typically, made of a resin, and thus hereinafter referred to as resin spacer) is attached into a through hole of the bus bar, which is provided for inserting a screw for attaching the bus bar to the chassis therethrough.

For example, where a bus bar is attached to a chassis, it is necessary to attach a resin spacer to the bus bar before the step of screw fastening, requiting a number of man-hours for attaching the resin spacer.

Furthermore, where a bus bar is attached to a chassis by screw fastening at a plurality of positions of the bus bar, the screw fastening is performed at the respective positions after a resin spacer is attached to each of the plurality of positions of the bus bar. As described above, where screw fastening is performed at a plurality of positions, during screw fastening being performed at a certain position, a resin spacer at another position may fall off the bus bar because of, e.g., vibration caused by the screw fastening. As described above, if a resin spacer falls off the bus bar, it is necessary to attach the resin spacer again, requiring an increased number of man-hours.

Also, when a bus bar is, e.g., transported after resin spacer attachment, resin spacers may fall off the bus bar. In such chassis, the bus bar cannot be used as it is and it is necessary to attach the resin spacers again, incurring a number of wasted man hours.

An object of the present invention is to provide a bus bar and an electronic device that prevent spacers from falling off the bus bar and incurs no wasteful process and rework during manufacture and use.

A bus bar according to a first aspect includes a bus bar body, and a spacer provided on the bus bar body, the spacer being an insulator. The bus bar body includes a first through hole portion forming a first through hole that allows a part of a fixing member for fixing the bus bar body to be inserted therethrough. The spacer includes a head portion, a body portion extending from the head portion, and a second through hole portion forming a second through hole that allows the part of the fixing member to be inserted therethrough and is a through hole extending from the head portion to the body portion. When the spacer is provided on the bus bar body, the head portion of the spacer covers at least a part of a peripheral edge region of an end opening of the first through hole and the body portion of the spacer covers an inner peripheral surface of the first through hole portion. An extremity of the body portion and a surface of the bus bar body are substantially in a same plane. An outer peripheral surface of the body portion is fixedly adhered to the inner peripheral surface of the first through hole portion so that resistance occurs when the spacer moves toward the head portion side relative to the bus bar body.

As a second aspect, in the bus bar according to the first aspect, at least a part of the first through hole portion of the bus bar body can be formed so that a cross-sectional area of a lower end side of the body portion of the spacer can be larger than a cross-sectional area of an upper end side of the body portion of the spacer.

As a third aspect, in the bus bar according to the second aspect, at least a part of the first through hole portion of the bus bar body can be chamfered so that the cross-sectional area of the lower end side of the first through hole is larger than the cross-sectional area of the upper end side of the through hole.

As a fourth aspect, in the bus bar according to the third aspect, the first through hole of the bus bar body can have a truncated conical shape in which the cross-sectional area of the lower end side is larger than the cross-sectional area of the upper end side.

As a fifth aspect, in the bus bar according to the third or fourth aspect, the bus bar body and the spacer can be formed by integral molding.

An electronic device according to a sixth aspect includes a chassis and a circuit fixed inside the chassis, the circuit including a bus bar according to any of the first to fifth aspects. A heat-transfer sheet for releasing heat of the bus bar body to the chassis is interposed between the surface of the bus bar, the surface being in the same plane as the extremity of the body portion and a position where the bus bar is fixed.

DESCRIPTION OF EMBODIMENTS

An embodiment of the present invention will be described with reference to the drawings. The below-described embodiment is not intended to limit the invention according to the claims, and not all the components and combinations thereof described in the embodiment are essential for a solution provided by the invention.

First, a DC-DC converter unit will be described as an example of an electronic device according to an embodiment of the present invention.

Figure 1:
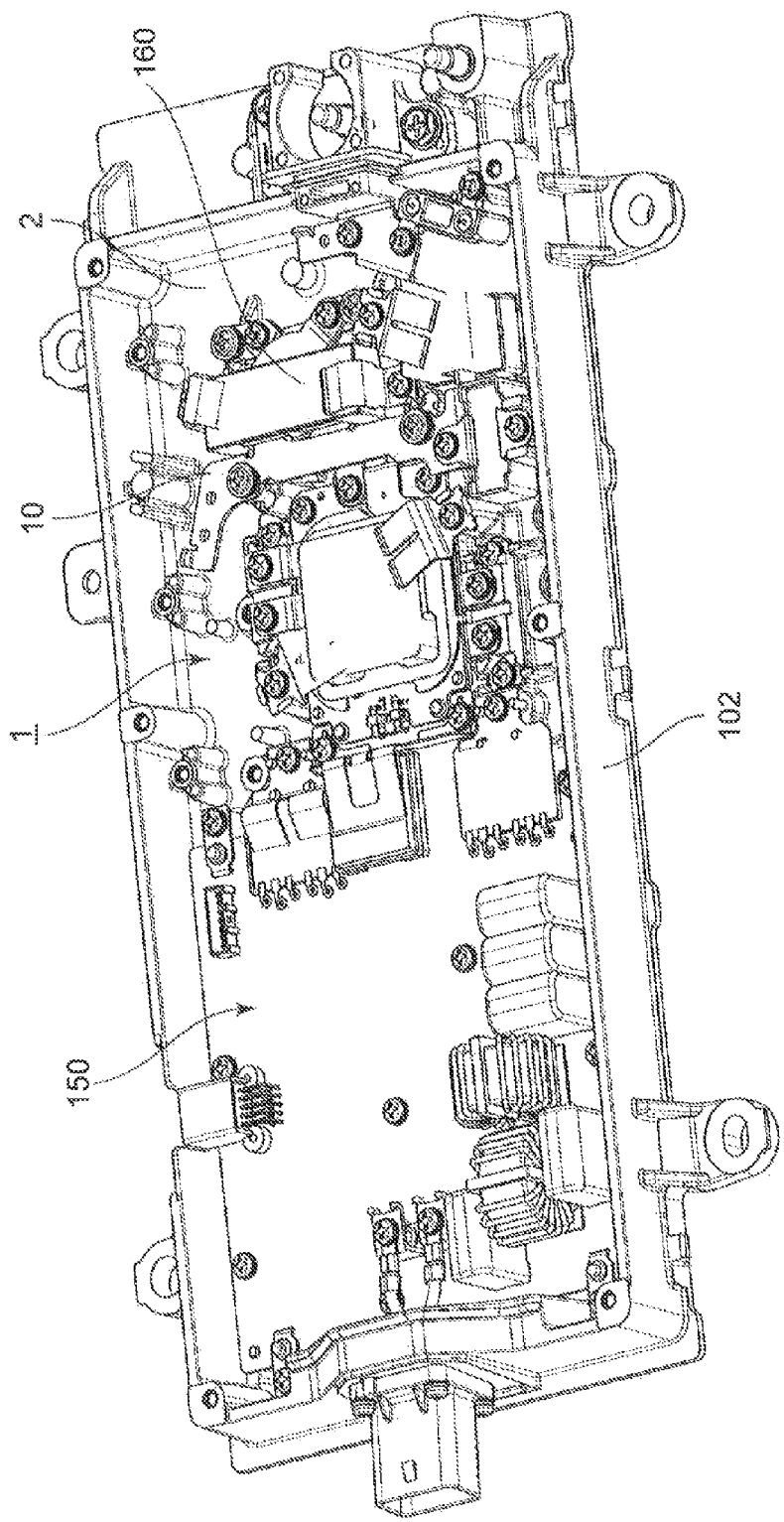
FIG. 1 is a perspective view of a DC-DC converter according to an embodiment of the present invention.
Figure 2:
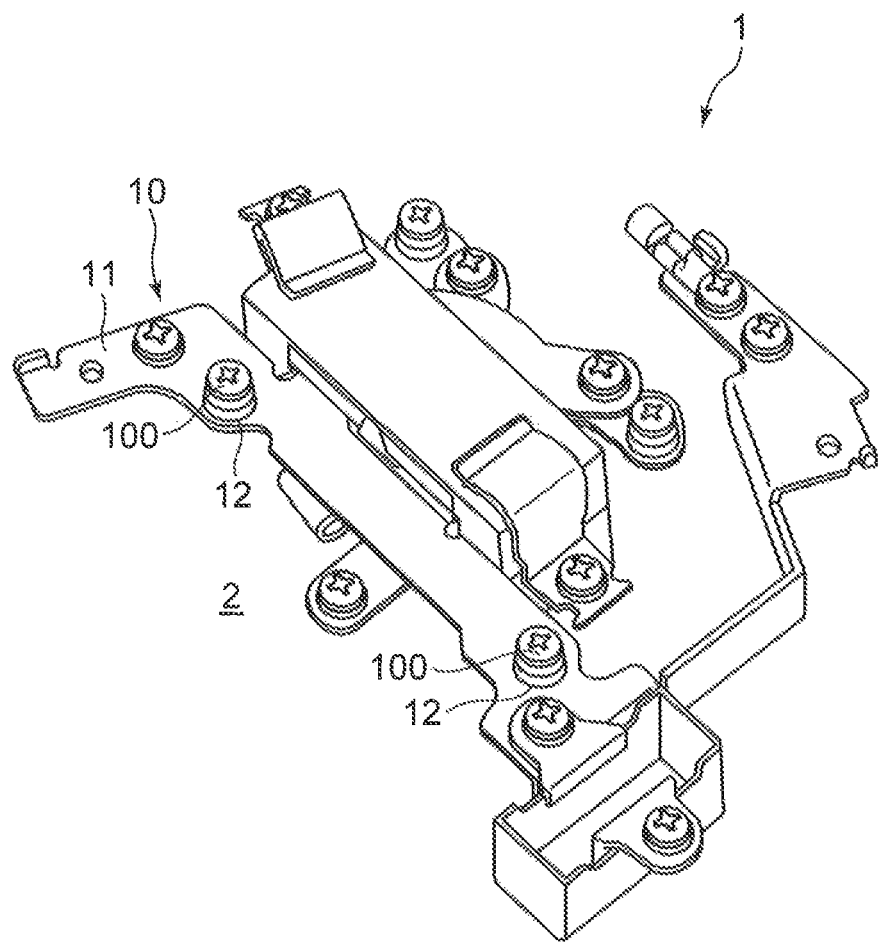
FIG. 2 is an enlarged view of a part in which a bus bar is mounted in the DC-DC converter illustrated in FIG. 1.
Figure 3:
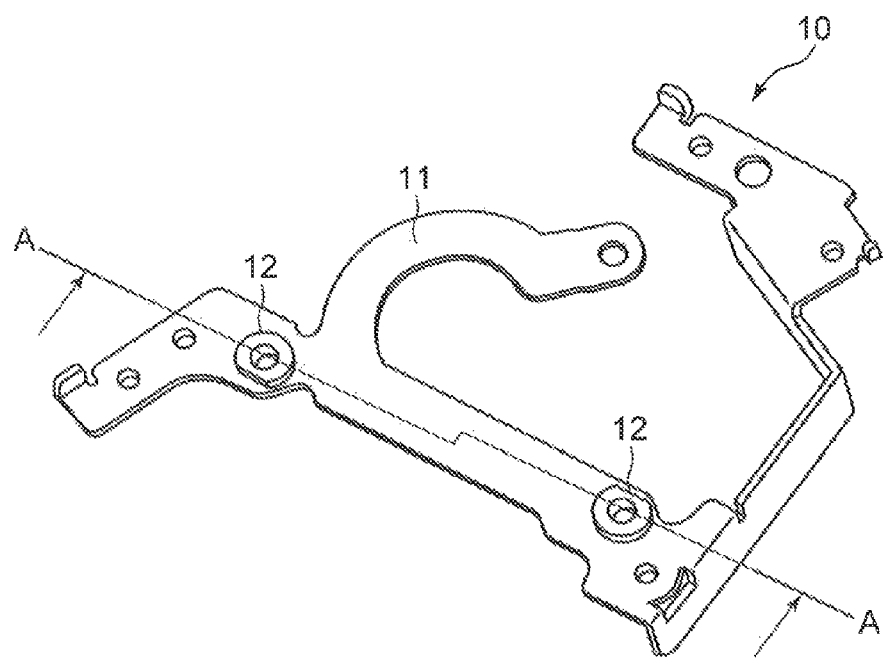
FIG. 3 is a perspective view illustrating a configuration of a bus bar according to the embodiment of the present invention.

FIG. 1 is a perspective view of a DC-DC converter according to an embodiment of the present invention. FIG. 2 is an enlarged view of a part in which a bus bar is mounted in the DC-DC converter illustrated in FIG. 1. FIG. 3 is a perspective view illustrating a configuration of the bus bar.

The DC-DC converter unit includes a chassis 102 and a DC-DC converter 1 housed in the chassis 102. The DC-DC converter unit is mounted in, for example, a hybrid vehicle or an electric vehicle, and converts a high direct current voltage supplied from a high-voltage battery that stores a voltage of around 100 to 500 V to a low direct current voltage and supplies the low direct current voltage to a low-voltage battery that stores a voltage of around 12 to 16 V. The DC-DC converter 1 includes, e.g., an electronic device circuit 150 including, for example, an input smoothing portion and a control portion, a transformer 140 that transforms an alternating current voltage, and a choke coil 160, which forms a component of a rectifier portion and an output smoothing portion provided on the output side. The choke coil 160 includes a bus bar 10 used as a coil portion. Hereinafter, in the present embodiment, a bus bar is the bus bar 10 used as a coil portion; however, a bus bar according to the present invention is not limited to a bus bar used as a coil portion.

The DC-DC converter 1 is fixed to a bottom plate 2 of the chassis 102. The bus bar 10 is attached to the bottom plate 2 via screws 100. In the present embodiment, the bus bar 10 is attached to the bottom plate 2 via two screws 100. The bus bar 10 includes a bus bar body 11 and resin spacers 12. Electric power is conducted to the bus bar body 11, and the bus bar body 11 acts as, for example, a part of the choke coil in the rectifier portion. The bus bar body 11 is a conductor of, e.g., a metal and so forth, and is formed by, for example, a flat conductor plate of, copper and so forth. Each of the resin spacers 12 includes, for example, an insulating resin, and ensures insulation between the bus bar body 11 and the corresponding screw 100. Consequently, the bus bar body 11 and the bottom plate 2 are prevented from being electrically conducted to each other via the screws 100. A notch may exist in a head portion of the resin spacer 12 The notch may be provided to, for example, prevent the head portion of the resin spacer 12 from protruding from the bus bar body 11.

Figure 4:
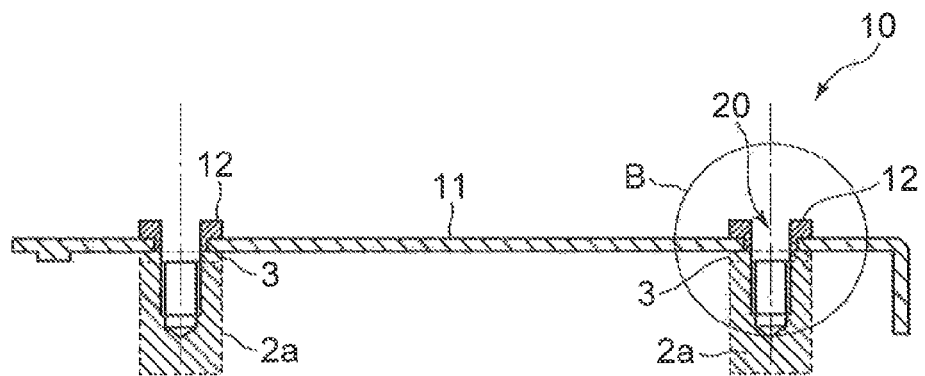
FIG. 4 is a cross-sectional diagram along A-A in FIG. 3.
Figure 5:
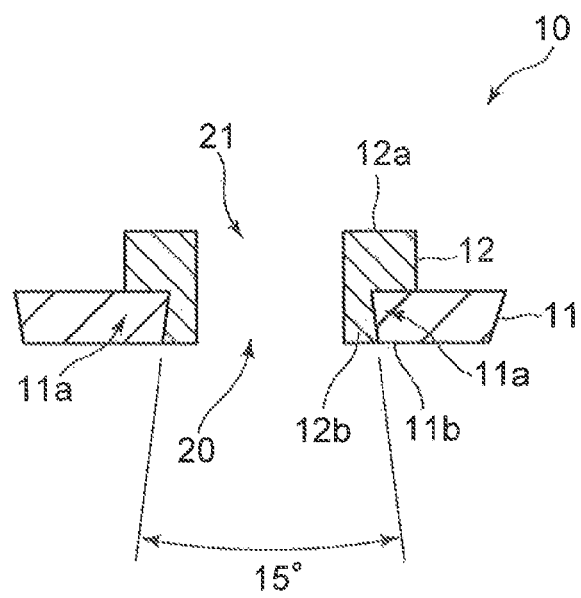
FIG. 5 is an enlarged view of area B in FIG. 4.

FIG. 3 is a perspective view illustrating a configuration of the bus bar 10. FIG. 4 is a cross-sectional diagram along A-A in FIG. 3 (FIG. 4 illustrates not only the bus bar 10 but also a part of members on which the bus bar is mounted). FIG. 5 is an enlarged view of area B in FIG. 4. Hereinafter, "lower" and "down" refer to a direction toward the side of the body portion. 12b of the resin spacer 12.

In the bus bar body 11, one or more through holes 20 for allowing shafts of the screws 100 to be inserted therethrough to attach the bus bar body 11 to the bottom plate 2 are formed. The resin spacers 12 are fixedly adhered to the through holes 20.

The bus bar 10 is mounted on attachment mounts 2a of the bottom plate 2 via insulating heat-transfer sheets 3, and thus, the bus bar body 11 is not electrically conducted to the attachment mounts 2a. In other words, in order to release heat of the bus bar body 11 to the chassis, the heat-transfer sheets 3 having an insulating function are interposed between the bus bar body 11 and the chassis.

Through hole portions 11a forming cut edges of the through holes 20 each have such an inclined surface (inversely-tapered shape) that a cross-section in a horizontal direction of the through hole 20 becomes larger toward the lower side. Accordingly, the through holes 20 each have a truncated conical shape in which a lower-side circle is larger than an upper-side circle. In the present embodiment, as illustrated in FIG. 5, the left and right inclined surfaces of each through hole portion 11a are formed so as to form an angle of approximately 15°.

Each resin spacer 12 includes a head portion 12a and a body portion 12b extending from the head portion 12a. Also, each resin spacer 12 includes a through hole 21 extending from the head portion 12a to the body portion 12b.

Although the head portion 12a may include a notch, the head portion 12a has a substantially round shape in a planar view. The area of an outer shape of the head portion 12a in a planar view is larger than the area of an end opening of the corresponding through hole 20 (opening on the upper surface side of the bus bar body 11). More specifically, for example, a diameter of the outer shape of the head portion 12a is longer than a diameter of the end opening of the through hole 20. Thus, when the resin spacer 12 is fixedly adhered to the through hole 20, the head portion 12a covers a region of the upper surface of the bus bar body 11, the region including a peripheral edge of the end opening of the through hole 20. Consequently, a head of the screw 100 is not brought into contact with the bus bar body 11. The shape of the head portion. 12a in a planar view may be any shape as long as such shape is a shape in which when the resin spacer 12 is fixedly adhered to the through hole 20, at least a part of the head portion 12a is placed on at least a part of the region of the peripheral edge of the end opening of the through hole 20.

The body portion 12b has a shape allowing an outer peripheral surface thereof to be in contact with an inner peripheral surface of the through hole portion 11a. Thus, when the resin spacer 12 is fixedly adhered to the through hole 20, the body portion 12b covers the inner peripheral surface of the through hole portion 11a. Consequently, the shaft of the screw 100 is not brought into contact with the bus bar body 11.

A length of the body portion 12b (distance from a boundary between the head portion 12a and the body portion 12b (an upper end side (proximal end side) of the body portion 12b) to a lower end side of the body portion 12b) is substantially equal to a thickness of the bus bar body 11, and a lower end surface of the body portion 12b is substantially horizontal. Consequently, when the resin spacer 12 is fixedly adhered to the through hole 20, the lower end surface of the body portion 12b and a lower surface of the bus bar body 11 are substantially in a same plane. Consequently, a lower surface of the bus bar 10 (the lower surfaces of the resin spacers 12 and the bus bar body 11) can be brought into close contact with the heat-transfer sheets 3, enabling efficient release of heat of the bus bar body 11 via the heat-transfer sheets 3.

At a substantial center of the head portion 12a and the body portion 12b of each resin spacer 12, a substantially-columnar through hole 21 for inserting the shaft of the corresponding screw 100 therethrough is formed. When the resin spacers 12 are fixedly adhered to the through holes 20, the shafts of the screws 100 are inserted into the respective through holes 21, and the bus bar 10 is fixed to the chassis via the screws 100.

As described above, the outer peripheral surface of the body portion 12b of each resin spacer 12 has a shape corresponding to the inner peripheral surface of the through hole portion ha of the bus bar body 11, that is, a shape whose cross-sectional area is larger toward the lower end side. Consequently, the body portion 11a provides resistance to upward movement of the resin spacer 12, enabling the resin spacer 12 to be prevented from coming off upward. Here, "upward" refers to the upper side in the drawings, and does not mean a direction of gravity. Even supposing that the upper side is a direction of gravity, the resin spacer 12 can be prevented from coming off in that direction. Because of the shape of the head portion 12a of each resin spacer 12, the resin spacer 12 does not come off downward. Accordingly, it is possible to properly prevent the resin spacer 12 from coming off the bus bar body 11.

Such resin spacers 12 can be manufactured, for example, as follows. First, a bus bar body 11, which is manufactured in advance, is housed in a resin molding mold for molding resin spacers 12, the mold having spaces corresponding to shapes of the resin spacers 12. Next, a molten thermoplastic resin is charged into the resin molding mold, is cured (solidified) and thereby molded. After the curing (solidification) of the resin, the bus bar body 11 and the resin spacers 12 are removed from the resin molding mold. Consequently, a bus bar 10 comprising resin spacers 12 integrated with a bus bar body 11 can be obtained.

Where the resin spacers 12 are manufactured in such a manner that the resin spacers 12 are integrated with the bus bar body 11 as described above, there are no restrictions that may occur where the resin spacers 12 are separately manufactured. For example, where the bus bar body 11 and the resin spacers 12 are separately manufactured, it is necessary to fit the resin spacers 12 into the bus bar body 11, requiring the resin spacers 12 to have a certain degree of flexibility; however, in the above-described method for integral molding of the bus bar body 11 and the resin spacers 12, no flexibility for the fitting is required, and thus, a step of fitting the resin spacers 12 into the bus bar body 11 is eliminated, enhancing easiness in manufacturing and an increase in choices of types of resin used for the resin spacers 12. Furthermore, where the resin spacers 12 are separately manufactured, a mold matching the outer shape of the body portions 12b of the resin spacers 12 is required; however, in the above-described manufacturing method, the bus bar body 11 itself acts as a mold for forming parts of the resin spacers 12, and thus, there is no need to provide a mold matching the outer shape of the body portions 12b of the resin spacers 12. It should be understood that resin spacers 12 may be manufactured and subsequently attached to the bus bar body 11.

Figure 6:
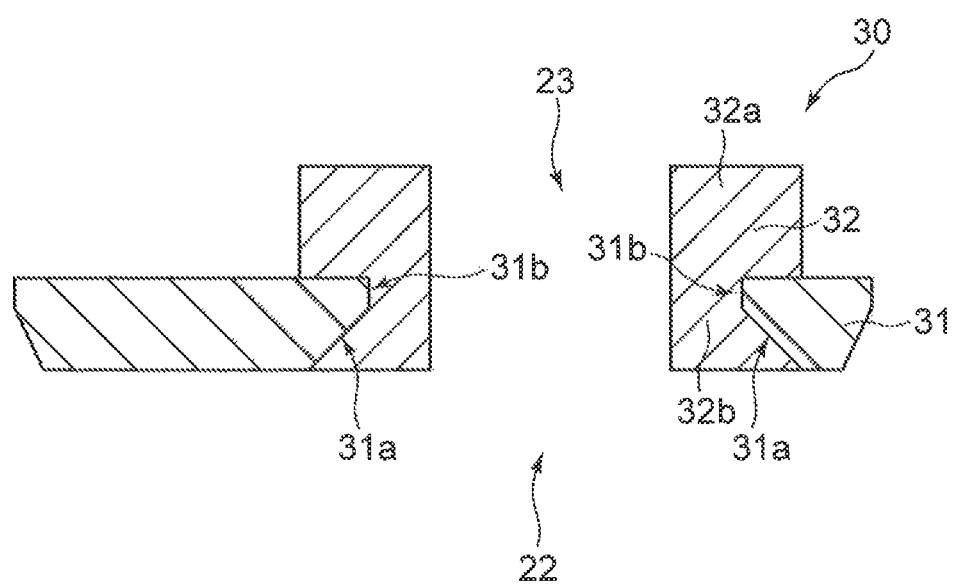
FIG. 6 is a cross-sectional diagram of a bus bar according to a variation of the embodiment of the present invention.

The shape of the inner peripheral surface of each through hole portion 11a of the bus bar body 11 and the shape of the outer peripheral surface of the body portion 12b of each resin spacer 12 are not limited to the above-described ones. For the shape of the inner peripheral surface of each through hole portion 11a and the outer peripheral surface of each body portion 12b, any shape can be employed as long as such shape is one that provides resistance to upward movement of the resin spacers 12 relative to the bus bar body 11 (shape that allows the body portion 12b of each resin spacer 12 to be fitted on the inner peripheral surface of each through hole portion 11a of the bus bar body 11) when the resin spacers 12 are fixedly adhered to the through hole 20. For example, it is possible that the outer peripheral surface of the body portion 12b of each resin spacer 12 includes a convex portion (or a concave portion) while the inner peripheral surface of each through hole portion 11a of bus bar body 11 includes a concave portion that fits on the convex portion (or a convex portion that fits in the concave portion). Alternatively, for example, as illustrated in FIG. 6, only a part (lower part) of each through hole 22 of the bus bar body 31 may be inversely tapered as in the above-described embodiment. An inner peripheral surface of each through hole portion 31a may be formed by performing chamfering for C0.5 to C1.0, that is, chamfering at an angle of 45° for a length of 0.5 to 1.0 mm of the inner peripheral surface. In the chassis of the through hole portions such as illustrated in FIG. 6, it is difficult to fit the bus bar body 31 and the resin spacer 32 together which are manufactured separately, and thus, the above-described integral molding method is particularly effective.

Although the present invention has been described based on the embodiment, the present invention is not limited to the above-described embodiment and is applicable to various other modes. For example, the spacers are not limited to those of a resin as along as such spacers are insulators.

What is claimed is:

1. A bus bar comprising:
   a bus bar body; and
   a spacer provided on the bus bar body, the spacer being an insulator,
   wherein the bus bar body includes a first through hole portion forming a first through hole that allows a part of a fixing member for fixing the bus bar body to be inserted therethrough;
   wherein the spacer includes a head portion, a body portion extending from the head portion, and a second through hole portion forming a second through hole that allows the part of the fixing member to be inserted therethrough and is a through hole extending from the head portion to the body portion;
   wherein when the spacer is provided on the bus bar body, the head portion covers at least a part of a peripheral edge region of an end opening of the first through hole and the body portion covers an inner peripheral surface of the first through hole portion;
   wherein a surface of the spacer including an extremity of the body portion and a surface of the bus bar body are substantially in a same plane;
   wherein at least a part of a surface of a heat-transfer sheet is in direct contact with an area including both the surface of the spacer and at least a part of the surface of the bus bar body and the heat transfer sheet releases heat of the bus bar body; and
   wherein an outer peripheral surface of the body portion is fixed to the inner peripheral surface of the first through hole portion by an interface resisting movement of the spacer toward the head portion side relative to the bus bar body and in a direction away from the bus bar body.

2. A bus bar according to claim 1, wherein at least a part of the first through hole portion of the bus bar body is formed so that a cross-sectional area of a lower end side of the body portion of the spacer is larger than a cross-sectional area of an upper end side of the body portion of the spacer.

3. A bus bar according to claim 2, wherein at least a part of the first through hole portion of the bus bar body is chamfered and the cross-sectional area of the lower end side of the first through hole is larger than the cross-sectional area of the upper end side of the first through hole.

4. A bus bar according to claim 3, wherein the first through hole of the bus bar body has a truncated conical shape and the cross-sectional area of the lower end side is larger than the cross-sectional area of the upper end side.

5. A bus bar according to claim 3, wherein the bus bar body and the spacer are formed by integral molding.

6. An electronic device comprising:
- a chassis; and
- a circuit fixed inside the chassis, the circuit including a bus bar,
- wherein the bus bar includes
- a bus bar body, and
- a spacer provided on the bus bar body, the spacer being an insulator;
- wherein the bus bar body includes a first through hole portion forming a first through hole that allows a part of a fixing member for fixing the bus bar body to an inside of the chassis to be inserted therethrough;
- wherein the spacer includes a head portion, a body portion extending from the head portion, and a second through hole portion forming a second through hole that allows the part of the fixing member to be inserted therethrough and is a through hole extending from the head portion to the body portion;
- wherein when the spacer is provided on the bus bar body, the head portion covers at least a part of a peripheral edge region of an end opening of the first through hole and the body portion covers an inner peripheral surface of the first through hole portion;
- wherein a surface of the spacer including an extremity of the body portion and a surface of the bus bar body are substantially in a same plane, a heat-transfer sheet is interposed between the bus bar body and the fixing member at a position where the bus bar body is fixed to the spacer and the heat-transfer sheet transfers heat of the bus bar body to the chassis, and an area including both the surface of the spacer and at least a part of the surface of the bus bar body directly contacts at least a part of a surface of the heat-transfer sheet; and
- wherein an outer peripheral surface of the body portion is fixed to the inner peripheral surface of the first through hole portion by an interface resisting movement of the spacer toward the head portion side relative to the bus bar body and in a direction away from the bus bar body.

7. A bus bar according to claim 1, wherein the inner peripheral surface of the first through hole portion fixed to the outer peripheral surface of the body portion has an inclined surface including an inversely-tapered shape, and the inversely-tapered shape has a cross-section in a horizontal direction of the first through hole that increases in an axial direction of the first through hole.

\* \* \* \* \*